(12) United States Patent
Yamamoto et al.

(10) Patent No.: US 10,018,664 B2
(45) Date of Patent: Jul. 10, 2018

(54) PHASE CONTROL DEVICE

(71) Applicant: MITSUBISHI ELECTRIC CORPORATION, Chiyoda-ku, Tokyo (JP)

(72) Inventors: Aya Yamamoto, Tokyo (JP); Tomohito Mori, Tokyo (JP); Daigo Matsumoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 234 days.

(21) Appl. No.: 14/905,128

(22) PCT Filed: Aug. 6, 2013

(86) PCT No.: PCT/JP2013/071261
§ 371 (c)(1),
(2) Date: Jan. 14, 2016

(87) PCT Pub. No.: WO2015/019418
PCT Pub. Date: Feb. 12, 2015

(65) Prior Publication Data
US 2016/0178687 A1    Jun. 23, 2016

(51) Int. Cl.
*G01R 31/04* (2006.01)
*G01R 31/327* (2006.01)
(Continued)

(52) U.S. Cl.
CPC ......... *G01R 31/041* (2013.01); *G01R 19/175* (2013.01); *G01R 25/00* (2013.01);
(Continued)

(58) Field of Classification Search
CPC .... G01R 31/41; G01R 31/327; G01R 19/175; H01H 71/10
See application file for complete search history.

(56) References Cited

U.S. PATENT DOCUMENTS

| 5,828,309 A | 10/1998 | Kumakura et al. |
| 6,212,446 B1 * | 4/2001 | Sato .......................... H02J 3/06 700/292 |

(Continued)

FOREIGN PATENT DOCUMENTS

| CN | 1136170 A | 11/1996 |
| CN | 101517683 A | 8/2009 |

(Continued)

OTHER PUBLICATIONS

Office Action dated Jan. 26, 2017, by the Chinese Patent Office in corresponding Chinese Patent Application No. 201380078692.5 and partial English translation of the Office Action. (17 pages).

(Continued)

*Primary Examiner* — Tung X Nguyen
*Assistant Examiner* — Dominic Hawkins
(74) *Attorney, Agent, or Firm* — Buchanan Ingersoll & Rooney PC

(57) ABSTRACT

A phase control device includes a connection error detection unit. The connection error detection unit includes a phase sequence detection unit that detects a phase sequence of voltage signals, a phase sequence detection unit that detects a phase sequence of current signals, a collation unit that collates the phase sequence of the voltage signals and the phase sequence of the current signals and determines that a connection error is present when the phase sequences are different, phase difference detection units that detect a phase difference between the voltage signal and the current signal, and a phase difference determination unit that determines, when the phase differences output from the phase difference detection units fall without a determination range, that a connection error is present.

7 Claims, 6 Drawing Sheets

(51) Int. Cl.
*G01R 19/175* (2006.01)
*G01R 25/00* (2006.01)
*H01H 71/10* (2006.01)
*H01H 33/59* (2006.01)
*G01R 23/00* (2006.01)
*G01R 29/18* (2006.01)

(52) U.S. Cl.
CPC .......... *G01R 31/327* (2013.01); *H01H 71/10* (2013.01); *G01R 23/005* (2013.01); *G01R 29/18* (2013.01); *H01H 33/59* (2013.01)

(56) References Cited

U.S. PATENT DOCUMENTS

| | | | |
|---|---|---|---|
| 6,433,980 B1 | 8/2002 | Tsutada et al. | |
| 2006/0020406 A1* | 1/2006 | Takakamo | G01R 19/2513 702/64 |
| 2010/0131215 A1* | 5/2010 | Kim | G01R 31/025 702/58 |
| 2010/0200383 A1 | 8/2010 | Saito | |
| 2012/0161750 A1* | 6/2012 | Moon | G01R 21/133 324/116 |
| 2014/0253091 A1* | 9/2014 | Ishihara | G01R 31/041 324/66 |

FOREIGN PATENT DOCUMENTS

| | | |
|---|---|---|
| JP | 04-262272 A | 9/1992 |
| JP | 2000-258484 A | 9/2000 |
| JP | 2001-124806 A | 5/2001 |
| JP | 2001-135205 A | 5/2001 |
| JP | 2007-292622 A | 11/2007 |
| JP | 2008-078079 A | 4/2008 |
| WO | WO 2013/061475 A1 | 5/2013 |

OTHER PUBLICATIONS

International Search Report (PCT/ISA/210) dated Oct. 8, 2013, by the Japanese Patent Office as the International Searching Authority for International Application No. PCT/JP2013/071261.
Written Opinion (PCT/ISA/237) dated Oct. 8, 2013, by the Japanese Patent Office as the International Searching Authority for International Application No. PCT/JP2013/071261.

* cited by examiner

PHASE CONTROL DEVICE

FIELD

The present invention relates to a phase control device for controlling the opening/closing timing of a circuit breaker in order to open or close a circuit breaker.

BACKGROUND

A phase control device outputs, after the elapse of a delay time, a closing control signal or an opening control signal in response to a command to open or a command to close a circuit breaker such that the circuit breaker is open or closed at a target phase, or a phase that is targeted (see Patent Literature 1).

In recent years, phase control devices have become widely used to control phase-regulation circuit breakers that close or open phase regulation equipment (e.g., a shunt reactor or a shunt capacitor) in order to regulate the reactive power in power systems.

However, a target phase of the time when a circuit breaker is open or closed depends on the phase of the three-phase alternating voltage and current signals input to the phase control device. Thus, if there is an error in the input of a three-phase alternating voltage or current signal, it is not possible to obtain a desired phase. Therefore, three-phase voltage and current measurement wiring that connects the phase control device and the circuit breaker needs to be connected accurately.

Connection error detection is widely performed in devices that measure electric power or the like, and a method of detecting connection errors using the product of the values of the voltage and the current is known (see Patent Literature 2).

CITATION LIST

Patent Literature

Patent Literature 1: Japanese Patent Application Laid-Open No. 2001-135205
Patent Literature 2: Japanese Patent Application Laid-Open No. 2001-124806

SUMMARY

Technical Problem

As described above, in order to control the opening and closing timing of a circuit breaker, it is necessary to detect the correct voltage and current signals for referring to a target phase.

For example, a target closing phase is preferably set to 0° in relation to voltage wires for closing a capacitor bank and 90° for closing a shunt reactor when there is no mechanical variation in the operating time of the circuit breaker. However, when wires are erroneously connected with in phase sequences or polarities, the circuit breaker is not closed at the target phase, and transient voltage and current may occur in the system during the closing.

Further, when wires are erroneously connected in phase sequences or polarities, re-ignition may occur in open periods, and the life span of nozzle contacts of the circuit breaker may be shortened in addition to the possibility of the occurrence of a transient voltage and current.

The present invention has been achieved in view of the above problems, and an objective of the present invention is to provide a phase control device that is capable of detecting connection errors of three-phase voltage and current measurement wirings with a simple and inexpensive configuration and capable of opening and closing a circuit breaker at a target phase.

Solution to Problem

In order to solve the problem and achieve the objective, the present invention relates to a phase control device capable of opening and closing a circuit breaker connected to a main circuit at a target phase. The phase control device includes: first to third voltage measurement terminals to which three-phase voltage measurement wirings for measuring a three-phase voltage of the circuit breaker are connected; first to third current measurement terminals to which three-phase current measurement wirings for measuring a three-phase main circuit current of the main circuit are connected; a voltage measurement unit that outputs voltage signals measured via the first to third voltage measurement terminals; a main circuit current measurement unit that outputs current signals measured via the first to third current measurement terminals; and a connection error detection unit capable of detecting a connection error of the three-phase voltage measurement wirings and the three-phase current measurement wirings by using the voltage signals output from the voltage measurement unit and the current signals output from the main circuit current measurement unit. The connection error detection unit includes: a phase sequence detection unit that detects a phase sequence of the voltage signals detected by the voltage measurement unit via the first to third voltage measurement terminals and a phase sequence of the current signals detected by the main circuit current measurement unit via the first to third current measurement terminals; a collation unit that collates the phase sequence of the voltage signals and the phase sequence of the current signals output from the phase sequence detection unit and determines that a connection error is present when the phase sequences are different; a phase difference detection unit that detects a first phase difference, which is a phase difference between the voltage signal detected via the first voltage measurement terminal and the current signal detected via the first current measurement terminal, a second phase difference, which is a phase difference between the voltage signal detected via the second voltage measurement terminal and the current signal detected via the second current measurement terminal, and a third phase difference, which is a phase difference between the voltage signal detected via the third voltage measurement terminal and the current signal detected via the third current measurement terminal; and a phase difference determination unit that, when a collation result by the collation unit indicates that the phase sequence of the voltage signals is identical to the phase sequence of the current signals, determines whether the first to third phase differences output from the phase difference detection unit fall within a determination range that is provided in advance in order to detect a connection error, and when any one of the first to third phase differences does not fall within the determination range, determines that a connection error is present.

Advantageous Effects of Invention

According to the present invention, it is possible to detect connection errors of three-phase voltage and current measurement wirings with a simple and inexpensive configuration and to open and close a circuit breaker at a target phase.

DESCRIPTION OF EMBODIMENTS

Hereinafter, a phase control device according to an exemplary embodiment of the present invention will be described in detail with reference to the drawings. Note that the present invention is not limited to this embodiment.

First Embodiment

Figure 1:
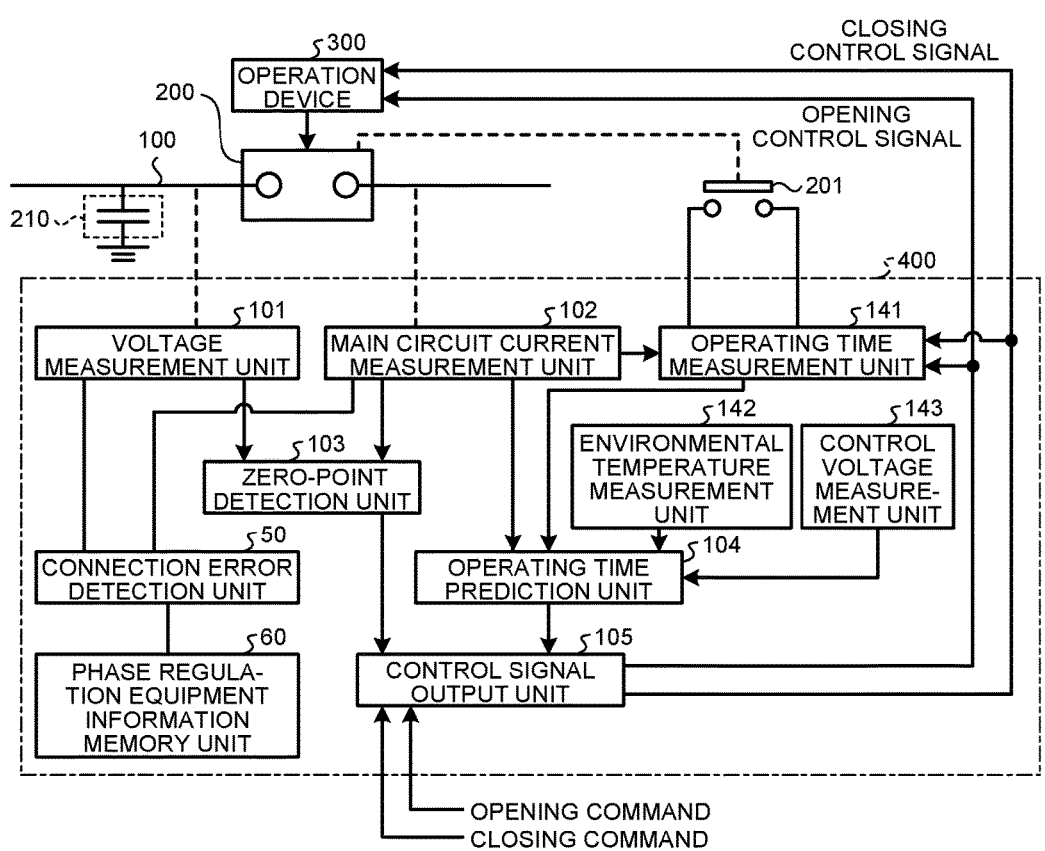
FIG. 1 is a block diagram of a power switching device according to a first embodiment.

FIG. 1 is a block diagram of a power switching device according to the present embodiment. As illustrated in FIG. 1, the power switching device according to the present embodiment includes a main circuit 100, a circuit breaker 200 connected to the main circuit 100, phase regulation equipment 210 connected to the main circuit 100, an operation device 300 for operating the circuit breaker 200, and a phase control device 400 for controlling the operation device 300. The circuit breaker 200 is, for example, a gas circuit breaker. Although the phase regulation equipment 210 illustrated is a shunt capacitor, the phase regulation equipment 210 may, for example, be a shunt reactor. A three-phase AC current flows in the main circuit 100.

The phase control device 400 according to the present embodiment includes a voltage measurement unit 101, a main circuit current measurement unit 102, a zero-point detection unit 103, an operating time prediction unit 104, a control signal output unit 105, an operating time measurement unit 141, an environmental temperature measurement unit 142, a control voltage measurement unit 143, a connection error detection unit 50, and a phase regulation equipment information memory unit 60. The phase control device 400 can open and close the circuit breaker 200 at a target phase.

The voltage measurement unit 101 measures the three-phase voltage across the circuit breaker 200. The main circuit current measurement unit 102 measures the three-phase main circuit current of the main circuit 100.

The zero-point detection unit 103 calculates the zero-point times of the interpolar voltage and the main circuit current on the basis of voltage signals and current signals measured by the voltage measurement unit 101 and the main circuit current measurement unit 102, respectively.

The operating time prediction unit 104 predicts the closing time or opening time of the circuit breaker 200. Upon detecting a closing or opening command, the control signal output unit 105 calculates the delay time on the basis of the latest zero-point time stored in the zero-point detection unit 103 and the closing or opening time predicted by the operating time prediction unit 104; and the signal output unit 105 then outputs a closing or opening control signal to the operation device 300 after the elapse of the delay time so that the circuit breaker is closed or opened on the interpolar voltage or the target phase of the main circuit current.

The operating time measurement unit 141 measures an opening time that is the time that elapses after the closing control signal is output and a movable contact (not illustrated) of the circuit breaker 200 makes contact or it measures an opening time that is the time taken for the movable contact to break contact after the opening control signal is output on the basis of the operating time of an auxiliary switch 201 that interlocks with the movable contact. The environmental temperature measurement unit 142 measures the environmental temperature around the circuit breaker 200. The control voltage measurement unit 143 measures the control voltage. The operating time prediction unit 104 corrects a reference closing time and a reference opening time, which is the operating time under a reference environmental condition of the circuit breaker 200, on the basis of the closing and opening time actually measured by the operating time measurement unit 141 and the environmental condition at that time (the temperature measured by the environmental temperature measurement unit 142 and the control voltage measured by the control voltage measurement unit 143) to thereby predict the closing or opening time of the circuit breaker 200.

The connection error detection unit 50 can detect connection errors in the three-phase voltage and current measurement wiring. In this case, the connection error detection unit 50 refers to the phase regulation equipment information stored in advance in the phase regulation equipment information memory unit 60. Here, the phase regulation equipment information is information for specifying the type of the phase regulation equipment 210 connected to the circuit breaker 200, and it is information for determining whether the connected phase regulation equipment is a reactor bank or a capacitor bank, for example. In a case where the phase regulation equipment 210 is not present, the information thereof is included in the phase regulation equipment information.

Figure 2:
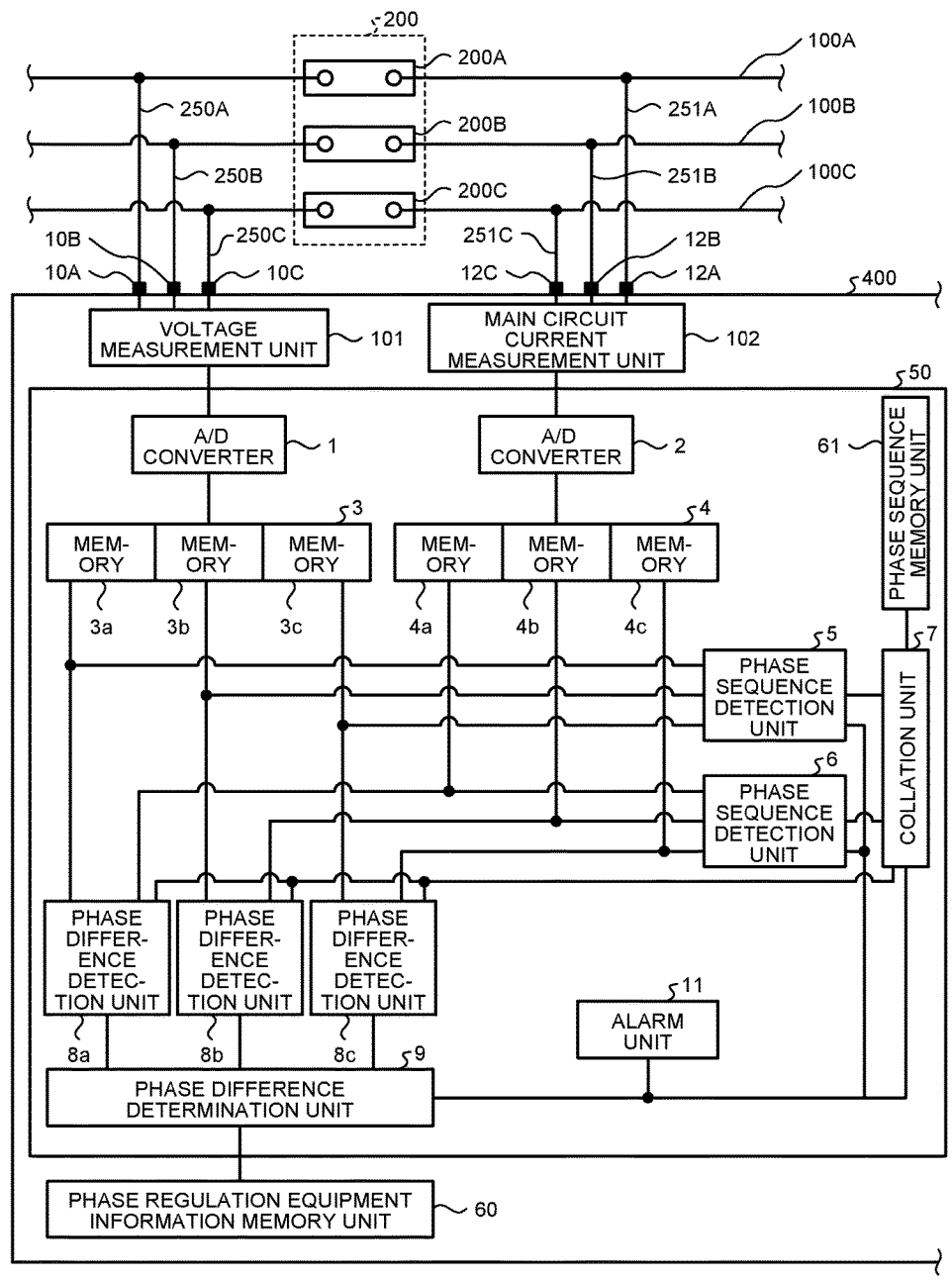
FIG. 2 is a diagram illustrating the configuration of a connection error detection unit according to the first embodiment.

Next, a detailed configuration of the connection error detection unit 50 is described with reference to FIG. 2. FIG. 2 is a diagram illustrating the configuration of the connection error detection unit 50. FIG. 2 also illustrates constituent elements associated with the input of the connection error detection unit 50. Specifically, the circuit breaker 200, the voltage measurement unit 101, the main circuit current measurement unit 102, the phase regulation equipment information memory unit 60, and the like are also illustrated.

The circuit breaker 200 includes an A-phase circuit breaker 200A, a B-phase circuit breaker 200B, and a C-phase circuit breaker 200C. Further, the main circuit 100 includes an A-phase main circuit 100A connected to the circuit breaker 200A, a B-phase main circuit 100B connected to the circuit breaker 200B, and a C-phase main circuit 100C connected to the circuit breaker 200C.

The phase control device 400 includes terminals 10A to 10C (first to third voltage measurement terminals) connected to the voltage measurement unit 101 and terminals 12A to 12C (first to third current measurement terminals) connected to the main circuit current measurement unit 102. The terminal 10A is connected to a voltage measurement wiring 250A for measuring the voltage of the circuit breaker 200A, the terminal 10B is connected to a voltage measurement wiring 250B for measuring the voltage of the circuit breaker 200B, and the terminal 10C is connected to a voltage measurement wiring 250C for measuring the voltage of the circuit breaker 200C. Connection errors occur when the terminals 10A to 10C and the voltage measurement wirings 250A to 250C are not respectively connected in the above combination. Further, the terminal 12A is connected to a current measurement wiring 251A for measuring the current flowing in the main circuit 100A, the terminal 12B is connected to a current measurement wiring 251B for measuring the current flowing in the main circuit 100B, and the terminal 12C is connected to a current measurement wiring 251C for measuring the current flowing in the main circuit 100C. Connection errors occur when the terminals 12A to 12C and the current measurement wirings 251A to 251C are not respectively connected in the above combination. FIG. 2 illustrates an example in which the voltage measurement wirings 250A to 250C and the current measurement wirings 251A to 251C are connected correctly. However, note that it is quite normal for connection errors resulting from human error to occur.

The terminals 10A to 10C are terminals connected to the voltage measurement wirings 250A to 250C for measuring the voltage at one side of the circuit breakers 200A to 200C. Actually, the other set of three terminals connected to the voltage measurement unit 101 are provided in the phase control device 400 in order to obtain an interpolar voltage; and these three terminals are connected to the other set of three-phase voltage measurement wirings for measuring the voltage at the other side of the circuit breakers 200A to 200C. However, because the detecting operation of connection errors described below is applied to the three-phase voltage measurement wirings 250A to 250C for measuring the voltage at one side of the circuit breakers 200A to 200C and the three-phase current measurement wirings 251A to 251C for measuring the current flowing in the main circuits 100A to 100C, the other three terminals and the other three-phase voltage measurement wirings are not illustrated. Further, the voltage measurement values output from the voltage measurement unit 101 to the connection error detection unit 50 are the measured voltages at one side of the circuit breakers 200A to 200C.

The connection error detection unit 50 includes A/D converters 1 and 2, memories 3 and 4, phase sequence detection units 5 and 6, a collation unit 7, phase difference detection units 8a to 8c, a phase difference determination unit 9, and an alarm unit 11. The memory 3 includes memories 3a to 3c, and the memory 4 includes memories 4a to 4c.

The A/D converter 1 is connected to the voltage measurement unit 101. The A/D converter 1 converts the analog three-phase voltage measurement values output from the voltage measurement unit 101 to digital values and outputs the digital values. Specifically, the A/D converter 1 stores the A/D-converted voltage value of the voltage signal input from the terminal 10A in the memory 3a; stores the A/D-converted voltage value of the voltage signal input from the terminal 10B in the memory 3b; and stores the A/D-converted voltage value of the voltage signal input from the terminal 10C in the memory 3c. When the voltage measurement wirings 250A to 250C are correctly connected to the terminals 10A to 10C, A-phase voltage values are time-sequentially stored in the memory 3a, B-phase voltage values are time-sequentially stored in the memory 3b, and C-phase voltage values are time-sequentially stored in the memory 3c.

The A/D converter 2 is connected to the main circuit current measurement unit 102. The A/D converter 2 converts the analog three-phase current measurement values output from the main circuit current measurement unit 102 to digital values and outputs the digital values. Specifically, the A/D converter 2 stores the A/D-converted main circuit current value of the current signal input from the terminal 12A in the memory 4a; stores the A/D-converted main circuit current value of the current signal input from the terminal 12B in the memory 4b; and stores the A/D-converted main circuit current value of the current signal input from the terminal 12C in the memory 4c. When the current measurement wirings 251A to 251C are correctly connected to the terminals 12A to 12C, A-phase main circuit current values are time-sequentially stored in the memory 4a; B-phase main circuit current values are time-sequentially stored in the memory 4b; and C-phase main circuit current values are time-sequentially stored in the memory 4c.

The phase sequence detection unit 5 is respectively connected to the memories 3a to 3c. The phase sequence detection unit 5 detects the phase sequence of the voltage signal detected via the terminal 10A, of the voltage signal detected via the terminal 10B, and of the voltage signal detected via the terminal 10C on the basis of the time-sequential voltage value read from the memory 3a, the time-sequential voltage value read from the memory 3b, and the time-sequential voltage value read from the memory 3c. That is, the phase sequence detection unit 5 detects the phase sequence by determining that the voltage signal detected via the terminal 10A is set for the earliest phase as a reference phase and by determining, in the following order, the voltage signal detected via the terminal 10B and the voltage signal detected via the terminal 10C such that the voltage signal having a phase difference of 120° compared with the other voltage signal and being further advanced than the other signal is set for as the next phase.

Specifically, for example, the phase sequence can be detected by comparing the zero-cross point of the time-sequential voltage values read from the memory 3a, the zero-cross point of the time-sequential voltage values read from the memory 3b, and the zero-cross point of the time-sequential voltage values read from the memory 3c. Here, the zero-cross point means a zero-point at which a voltage value changes from negative to positive.

If the voltage measurement wirings 250A to 250C are correctly connected to the terminals 10A to 10C, the phase sequence detection unit 5 detects, in the following order, the phase sequence as the zero-cross points of the voltage signal detected via the terminal 10A, the voltage signal detected via the terminal 10B, and the voltage signal detected via the terminal 10C.

Meanwhile, if the voltage measurement wirings 250A to 250C are not correctly connected to the terminals 10A to 10C, for example, the voltage measurement wiring 250B is connected to the terminal 10A, the voltage measurement wiring 250A is connected to the terminal 10B, and the voltage measurement wiring 250C is connected to the terminal 10C, the phase sequence detection unit 5 detects, in the following order, the phase sequence as the zero-cross points of the voltage signal detected via the terminal 10A, the voltage signal detected via the terminal 10C, and the voltage signal detected via the terminal 10B.

Further, when the voltage measurement wirings 250A to 250C are not correctly connected to the terminals 10A to 10C, for example, the voltage measurement wiring 250B is connected to the terminal 10A, the voltage measurement wiring 250C is connected to the terminal 10B, and the voltage measurement wiring 250A is connected to the terminal 10C, the phase sequence detection unit 5 detects, in the following order, the phase sequence as the zero-cross points of the voltage signal detected via the terminal 10A, the voltage signal detected via the terminal 10B, and the voltage signal detected via the terminal 10C.

In this manner, the phase sequence detection unit 5 detects the phase sequence of the voltage signals detected via the terminals 10A to 10C. The phase sequence detection unit 5 outputs the detected phase sequence data to the collation unit 7. Further, when the zero-cross point is not present in the voltage values, the phase sequence detection unit 5 transmits a control signal that causes the alarm unit 11 to output an alarm signal because the target phase cannot be detected.

The phase sequence detection unit 6 is connected to the memories 4a to 4c. The phase sequence detection unit 6 detects the phase sequence of the current signal detected via the terminal 12A, the current signal detected via the terminal 12B, and the current signal detected via the terminal 12C on the basis of the time-sequential main circuit current values read from the memory 4a, the time-sequential main circuit current values read from the memory 4b, and the time-sequential main circuit current values read from the memory 4c. That is, the phase sequence detection unit 6 detects the phase sequence by determining that the current signal detected via the terminal 12A corresponds to the earliest phase as a reference phase; and by determining, in the following order, the current signal detected via the terminal 12B and the current signal detected via the terminal 12C, each having the phase difference being 120°, such that the phase of the current signal that advances further than the other corresponds to the next phase. The phase sequence detection method is the same as that of the phase sequence detection unit 5, and description of the specific example is omitted.

In this manner, the phase sequence detection unit 6 detects the phase sequence of the current signals detected via the terminals 12A to 12C. The phase sequence detection unit 6 outputs the detected phase sequence data to the collation unit 7. Further, when the zero-cross point is not present in the main circuit current values, the phase sequence detection unit 6 transmits a control signal that causes the alarm unit 11 to output an alarm signal because the target phase cannot be detected.

Note that in the present embodiment, the phase sequence detection units 5 and 6 are independent from each other, but these units may be integrally configured as one unit.

The collation unit 7 is connected to the phase sequence detection units 5 and 6. The collation unit 7 compares and collates the phase sequence data output from the phase sequence detection units 5 and 6; determines that a connection error is present when the phase sequence of the voltage signals is different from the phase sequence of the current signals; and transmits a control signal that causes the alarm unit 11 to output an alarm signal. When both the connection of the voltage measurement wirings 250A to 250C and the connection of the current measurement wirings 251A to 251C are correct, the phase sequence of the voltage signals is identical to the phase sequence of the current signals. Thus, the difference between the phase sequence of the voltage signals and the phase sequence of the current signals occurs when a connection error is present in at least one of the connection of the voltage measurement wirings 250A to 250C and the connection of the current measurement wirings 251A to 251C.

However, a case may arise where the collation unit 7 cannot detect a connection error even though it is present. For example, given that when the connection of the voltage measurement wirings 250A to 250C is correct but the connection of the current measurement wiring 251A to 251C is incorrect, then the current measurement wiring 251B is connected to the terminal 12A. In this case, the current measurement wiring 251C is connected to the terminal 12B and the current measurement wiring 251A is connected to the terminal 12C, but the phase sequence detected by the phase sequence detection unit 5 is identical to the phase sequence detected by the phase sequence detection unit 6. Thus, this connection error is not detected by the collation unit 7. Such a connection error is detected by the phase difference determination unit 9, which is described later.

The phase difference detection units 8a to 8c are connected to the memories 3a to 3c and 4a to 4c and the collation unit 7. The phase difference detection unit 8a is connected to the memories 3a and 4a. The phase difference detection unit 8b is connected to the memories 3b and 4b. The phase difference detection unit 8c is connected to the memories 3c and 4c. Further, the phase difference detection units 8a to 8c are connected to the phase sequence detection units 5 and 6 and the collation unit 7.

When the collation result by the collation unit 7 indicates that the detection result of the phase sequence of the voltage signals is identical to the detection result of the phase sequence of the current signals, the phase difference detection unit 8a detects a phase difference between the voltage signal detected via the terminal 10A and the current signal detected via the terminal 12A on the basis of the time-sequential voltage values read from the memory 3a and the time=sequential main circuit current values read from the memory 4a. This phase difference can be detected by calculating the time difference between the zero-cross point of the time-sequential voltage values read from the memory 3a and the zero-cross point of the main circuit current values read from the memory 4a, for example.

The phase difference detection units 8b and 8c perform the same process as the phase difference detection unit 8a. That is, the phase difference detection unit 8b detects the phase difference between the voltage signal detected via the terminal 10B and the current signal detected via the terminal 12B on the basis of the time-sequential voltage values read from the memory 3b and the time-sequential main circuit current values read from the memory 4b. This phase difference can be detected by calculating the time difference between the zero-cross point of the time-sequential voltage values read from the memory 3b and the zero-cross point of the main circuit current values read from the memory 4b, for example. Further, the phase difference detection unit 8c detects the phase difference between the voltage signal detected via the terminal 10C and the current signal detected via the terminal 12C on the basis of the time-sequential voltage values read from the memory 3c and the time-sequential main circuit current values read from the memory 4c. This phase difference can be detected by calculating the time difference between the zero-cross point of the time-sequential voltage values read from the memory 3c and the zero-cross point of the main circuit current values read from the memory 4c, for example. The phase difference detection units 8a to 8c output the phase difference detection results to the phase difference determination unit 9.

Note that in the present embodiment, although the phase difference detection units 8a to 8c are independent from each other, these units may be integrally configured as one unit.

The phase difference determination unit 9 is connected to the phase difference detection units 8a to 8c and the phase regulation equipment information memory unit 60. The phase difference determination unit 9 refers to the phase regulation equipment information stored in the phase regulation equipment information memory unit 60 and acquires information on whether the phase regulation equipment 210 is present and information on the type thereof when the phase regulation equipment 210 is present. Further, the phase difference determination unit 9 has stored therein determination range information for detecting connection errors when the phase regulation equipment 210 is not present or on the basis of the type thereof when the phase regulation equipment 210 is present. The determination range is provided in advance in order to detect connection errors and includes phase differences in which a connection error is not present. For example, when the phase regulation equipment 210 is not present and a connection error is not present, all phase differences detected by the phase difference detection units 8a to 8c are 0°. Thus, by providing a certain range around 0° to the phase difference determination unit 9 as the determination range when phase regulation equipment is not present, the phase difference determination unit 9 can determine whether the phase differences detected by the phase difference detection units 8a to 8c fall within the determination range when phase regulation equipment is not present and can determine that a connection error is present if any one of the phase differences does not fall within the determination range.

Similarly, for example, in a case where the phase regulation equipment 210 is a capacitor bank and a connection error is not present, all phase differences detected by the phase difference detection units 8a to 8c are 270° for voltages. Thus, by providing a certain range around 270° in advance to the phase difference determination unit 9 as the determination range of the capacitor bank, the phase difference determination unit 9 can determine whether the phase differences detected by the phase difference detection units 8a to 8c fall within the determination range of the capacitor bank and can determine the presence of a connection error if any one of the phase differences does not fall within the determination range.

Similarly, for example, in a case where the phase regulation equipment 210 is a reactor bank and a connection error is not present, all phase differences detected by the phase difference detection units 8a to 8c are 90° for voltages. Thus, by providing a certain range around 90° in advance to the phase difference determination unit 9 as the determination range of the reactor bank, the phase difference determination unit 9 can determine whether the phase differences detected by the phase difference detection units 8a to 8c fall within the determination range of the reactor bank and can determine the presence of a connection error if any one of the phase differences does not fall within the determination range.

The alarm unit 11 outputs an alarm signal in accordance with a control signal from the phase sequence detection unit 5, the phase sequence detection unit 6, the collation unit 7, or the phase difference determination unit 9.

Further, a phase sequence memory unit 61 is connected to the collation unit 7. The phase sequences of the terminals 10A to 10C and the terminals 12A to 12C, when the phase control device 400 is correctly connected, are determined in advance by a substation. That is, the phase sequence information determined in advance by a substation in which the phase control device 400 is installed or an electric power station of the substation or the like is stored in advance in the phase sequence memory unit 61. The phase sequence information indicates whether the phase sequences of the voltage signals detected by the terminals 10A to 10C and the current signals detected by the terminals 12A to 12C are a forward phase sequence or a backward phase sequence, which will be described later.

Figure 3:
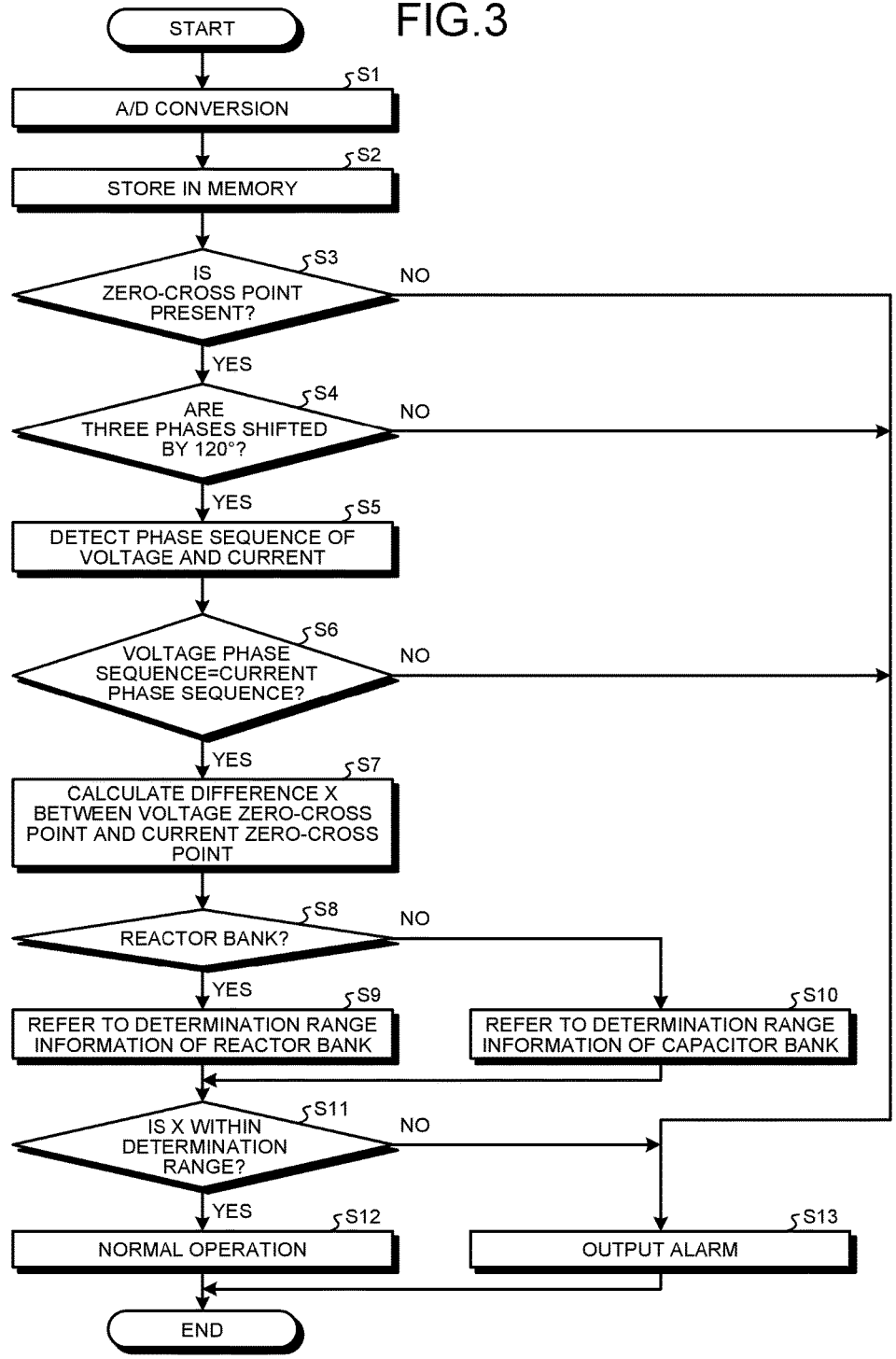
FIG. 3 is a flowchart describing the operation according to the first embodiment.

Next, the operation of the present embodiment will be described with reference to FIG. 3. FIG. 3 is a flowchart for describing the operation of the present embodiment.

The voltage measurement unit 101 measures the three-phase voltage via the three-phase voltage measurement wirings 250A to 250C and periodically outputs the measured values to the A/D converter 1. The main circuit current measurement unit 102 measures the three-phase main circuit current via the three-phase current measurement wirings 251A to 251C and periodically outputs the measured values to the A/D converter 2. The A/D converter 1 A/D-converts the three-phase voltage signals output from the voltage measurement unit 101 (S1) and stores the voltage signals input from the terminals 10A to 10C in the memories 3a to 3c, respectively (S2). Further, the A/D converter 2 A/D-converts the three-phase current signals output from the main circuit current measurement unit 102 (S1) and stores the current signals input from the terminals 12A to 12C in the memories 4a to 4c (S2).

Subsequently, the phase sequence detection unit 5 calculates the zero-cross point of the time-sequential voltage values read from the memory 3a, the zero-cross point of the time-sequential voltage values read from the memory 3b, and the zero-cross point of the time-sequential voltage values read from the memory 3c (S3). Specifically, the phase sequence detection unit 5 samples the time-sequential data of the voltage values read from the memories 3a to 3c at the same sampling points and designates the zero-cross points by the data numbers which are the serial number of the sampling points. For example, when wires are correctly connected, if one cycle is sampled at 60 points, because the zero-cross points are present at approximately 60 intervals, the zero-cross points of the voltage values read from the memory 3a can be expressed by 10, 70, 130, . . . , and the like; the zero-cross points of the voltage values read from the memory 3b can be expressed by 30, 90, 150, . . . , and the like; and the zero-cross points of the voltage values read from the memory 3c can be expressed by 50, 110, 170, . . . , and the like. When the zero-cross point from any one of the time-sequential voltage values read from the memory 3a, the time-sequential voltage values read from the memory 3b, and the time-sequential voltage values read from the memory 3c (S3: No) cannot be detected, the phase sequence detection unit 5 transmits a control signal to the alarm unit 11 to cause the alarm unit 11 to output an alarm signal (S13).

Similarly, the phase sequence detection unit 6 calculates the zero-cross point of the time-sequential main circuit current values read from the memory 4a, the zero-cross point of the time-sequential main circuit current values read from the memory 4b, and the zero-cross point of the time-sequential main circuit current values read from the memory 4c (S3). Specifically, the phase sequence detection unit 6 samples the time-sequential data of the main circuit current values read from the memories 4a to 4c at the same sampling points and designates the zero-cross points by using the data numbers which are the serial numbers of the sampling points. When the zero-cross point from any one of the time-sequential main circuit current values read from the memory 4a, the time-sequential main circuit current values read from the memory 4b, and the time-sequential main circuit current values read from the memory 4c (S3: No) cannot be detected, the phase sequence detection unit 6 transmits a control signal to the alarm unit 11 to cause the alarm unit 11 to output an alarm signal (S13).

Subsequently, the phase sequence detection unit 6 determines whether the three phases of the voltage values and the main circuit current values are shifted by 120° (S4). That is, the phase sequence detection unit 6 determines whether the zero-cross point of the time-sequential data read from the memory 3a, the zero-cross point of the time-sequential data read from the memory 3b, and the zero-cross point of the time-sequential data read from the memory 3c are shifted by approximately 20 points. Similarly, the phase sequence detection unit 6 determines whether the zero-cross point of the time-sequential data read from the memory 4a, the zero-cross point of the time-sequential data read from the memory 4b, and the zero-cross point of the time-sequential data read from the memory 4c are shifted by approximately 20 points. Even if the voltage measurement wirings 250A to 250C are incorrectly connected to the terminals 10A to 10C, because a sequence is detectable in which the three phases are shifted by 120°, a case where the three phases are not shifted by 120° occurs when a certain erroneous signal other than the voltage signal is input to the terminals 10A to 10C. Similarly, even if the current measurement wirings 251A to 251C are incorrectly connected to the terminals 12A to 12C, because a sequence is detectable in which the three phases are shifted by 120° is detectable, a case where the three phases are not shifted by 120° occurs when a certain erroneous signal other than the voltage signal is input to the terminals 12A to 12C. Here, the determination range is set between approximately 18 and 22, for example, around 20, with taking a sampling error into consideration. When it is determined that the three phases are not shifted by 120°, the phase sequence detection unit 6 determines that an incorrect signal is input to the terminals 10A to 10C or the terminals 12A to 12C and transmits a control signal to the alarm unit 11 so as to cause the alarm unit 11 to output an alarm signal (S13).

Subsequently, when the zero-cross point is present and the three phases are shifted by 120°, the phase sequence detection unit 5 detects the phase sequence of the voltage signal detected via the terminal 10A, the voltage signal detected via the terminal 10B, and the voltage signal detected via the terminal 10C on the basis of the time-sequential voltage values read from the memory 3a, the time-sequential voltage values read from the memory 3b, and the time-sequential voltage values read from the memory 3c (S5).

Specifically, for example, the phase sequence detection unit 5 detects the phase sequence by regarding the phase of a voltage signal corresponding to the time-sequential voltage values read from the memory 3a as the first phase, regarding the phase of a voltage signal corresponding to a voltage value having a zero-cross point of which the data number is shifted by 20 from that of the zero-cross point of the voltage value of the first phase as the subsequent phase, and regarding the phase of the remaining voltage signal as the last phase. Here, when the data number is shifted by 20, the phase is shifted by 120°. Note that the voltage signal used as the reference when detecting the phase sequence may be other than the voltage signal corresponding to the time-sequential voltage values read from the memory 3a.

Similarly, the phase sequence detection unit 6 detects the phase sequence of the current signal detected via the terminal 12A, the current signal detected via the terminal 12B, and the current signal detected via the terminal 12C on the basis of the time-sequential main circuit current values read from the memory 4a, the time-sequential main circuit current values read from the memory 4b, and the time-sequential main circuit current values read from the memory 4c (S5).

Specifically, for example, the phase sequence detection unit 6 detects the phase sequence by regarding the phase of a current signal corresponding to the time-sequential main circuit current values read from the memory 4a as the first phase, regarding the phase of a current signal corresponding to a main circuit current value having a zero-cross point of which the data number is shifted by 20 from that of the zero-cross point of the main circuit current value of the first phase as the subsequent phase, and regarding the phase of the remaining current signal as the last phase. Here, when the data number is shifted by 20, the phase is shifted by 120°. Note that the current signal used as the reference when detecting the phase sequence may be other than the current signal corresponding to the time-sequential main circuit current values read from the memory 4a.

Subsequently, the collation unit 7 compares and collates the phase sequence data output from the phase sequence detection units 5 and 6 (S6), determines that a connection error is present when the phase sequence of the voltage signals is different from the phase sequence of the current signals (S6: No), and transmits a control signal that causes the alarm unit 11 to output an alarm signal (S13).

Subsequently, when the collation result in the collation unit 7 indicates that the detection result of the phase sequence of the voltage signals is identical to the detection result of the phase sequence of the current signals (S6: Yes), the phase difference detection unit 8a detects a phase difference between the voltage signal detected via the terminal 10A and the current signal detected via the terminal 12A on the basis of the time-sequential voltage values read from the memory 3a and the time-sequential main circuit current values read from the memory 4a (S7). This phase difference can be detected by calculating the difference X between the zero-cross point of the time-sequential voltage values read from the memory 3a and the zero-cross point of the main circuit current values read from the memory 4a. In this case, the difference X can be detected as the difference of the data number. Note that the phase difference detection units 8b and 8c perform the same operation as the phase difference detection unit 8a.

Subsequently, the phase difference determination unit 9 refers to the phase regulation equipment information stored in the phase regulation equipment information memory unit 60 to determine whether the phase regulation equipment 210 is a reactor bank or a capacitor bank (S8). In this example, it is assumed that the phase regulation equipment 210 is present. Note that the same is true when the phase regulation equipment 210 is not present as described above.

In a case where the phase regulation equipment 210 is a reactor bank (S8: Yes), the phase difference determination unit 9 refers to the determination range information of the reactor bank provided in advance (S9) to determine whether the phase differences detected by the phase difference detection units 8a to 8c fall within the determination range of the reactor bank (S11). When any one of the phase differences does not fall within the determination range (S11: No), the phase difference determination unit 9 determines that a connection error is present and transmits a control signal that causes the alarm unit 11 to output an alarm signal (S13). When all phase differences fall within the determination range (S11: Yes), the phase control device 400 operates normally (S12).

Here, in a case where the phase regulation equipment 210 is a reactor bank, because the phase of the current signal lags the voltage signal, the phase difference between the voltage zero-cross point and the current zero-cross point is around 90° and the difference between data numbers is around 15.

Meanwhile, when all three phases of the current signal are reverse (that is, the current measurement wiring 251C is connected to the terminal 12A, the current measurement wiring 251B is connected to the terminal 12B, and the current measurement wiring 251A is connected to the terminal 12C), the phase difference is around 270°. Further, when the current measurement wiring 251C is connected to the terminal 12A, the current measurement wiring 251A is connected to the terminal 12B, and the current measurement wiring 251B is connected to the terminal 12C, the phase difference is around 210°. Further, when the current measurement wiring 251B is connected to the terminal 12A, the current measurement wiring 251C is connected to the terminal 12B, and the current measurement wiring 251A is connected to the terminal 12C, the phase difference is around 330°. Thus, when the determination range of the reactor bank is set to between approximately 13 and 17 including a sampling error around the data number of 15, it is possible to detect connection errors.

In a case where the phase regulation equipment 210 is a capacitor bank (S8: No), the phase difference determination unit 9 refers to the determination range information of the capacitor bank provided in advance (S10) to determine whether the phase differences detected by the phase difference detection units 8a to 8c fall within the determination range of the capacitor bank (S11). When any one of the phase differences does not fall within the determination range (S11: No), the phase difference determination unit 9 determines that a connection error is present and transmits a control signal that causes the alarm unit 11 to output an alarm signal (S13). When all phase differences fall within the determination range (S11: Yes), the phase control device 400 operates normally (S12).

Here, in a case where the phase regulation equipment 210 is a capacitor bank, because the phase of the current signal leads the voltage signal, the phase difference between the voltage zero-cross point and the current zero-cross point is around 270° and the difference between data numbers is around 45. Meanwhile, when all three phases of the current signal are reverse (that is, the current measurement wiring 251C is connected to the terminal 12A, the current measurement wiring 251B is connected to the terminal 12B, and the current measurement wiring 251A is connected to the terminal 12C, the phase difference is around 90°. Further, when the current measurement wiring 251C is connected to the terminal 12A, the current measurement wiring 251A is connected to the terminal 12B, and the current measurement wiring 251B is connected to the terminal 12C, the phase difference is around 30°. Further, when the current measurement wiring 251B is connected to the terminal 12A, the current measurement wiring 251C is connected to the terminal 12B, and the current measurement wiring 251A is connected to the terminal 12C, the phase difference is around 150°. Thus, when the determination range of the capacitor bank is set to between approximately 43 and 47 including the sampling error around the data number of 45, it is possible to detect connection errors.

Note that when both the voltage measurement wirings 250A to 250C and the current measurement wirings 251A to 251C are incorrectly connected and both are incorrectly connected similarly, the connection error is not detected by the phase difference determination unit 9. For example, when the voltage measurement wiring 250B is connected to the terminal 10A, the voltage measurement wiring 250C is connected to the terminal 10B, and the voltage measurement wiring 250A is connected to the terminal 10C, and the current measurement wiring 251B is connected to the terminal 12A, the current measurement wiring 251C is connected to the terminal 12B, and the current measurement wiring 251A is connected to the terminal 12C, the connection error is not detected by the phase difference determination unit 9. Such similar connection errors of the voltage measurement wirings 250A to 250C and the current measurement wirings 251A to 251C occur in the following five patterns.

Specifically, in addition to the following pattern described above, (1) Terminal (10A, 10B, 10C)→Voltage measurement wiring (250B, 250C, 250A), and
Terminal (12A, 12B, 12C)→Current measurement wiring (251B, 251C, 251A),
the connection error patterns include:
(2) Terminal (10A, 10B, 10C)→Voltage measurement wiring (250C, 250A, 250B), and
Terminal (12A, 12B, 12C)→Current measurement wiring (251C, 251A, 251B);
(3) Terminal (10A, 10B, 10C)→Voltage measurement wiring (250A, 250C, 250B), and
Terminal (12A, 12B, 12C)→Current measurement wiring (251A, 251C, 251B);
(4) Terminal (10A, 10B, 10C)→Voltage measurement wiring (250C, 250B, 250A), and
Terminal (12A, 12B, 12C)→Current measurement wiring (251C, 251B, 251A);
(5) Terminal (10A, 10B, 10C)→Voltage measurement wiring (250B, 250A, 250C), and
Terminal (12A, 12B, 12C)→Current measurement wiring (251B, 251A, 251C).

In this case, the following connection pattern is a correct connection.
(6) Terminal (10A, 10B, 10C)→Voltage measurement wiring (250A, 250B, 250C), and
Terminal (12A, 12B, 12C)→Current measurement wiring (251A, 251B, 251C).

Such a connection error can be detected by the following process. First, because the phase sequence is determined in advance by the substation in which the phase control device 400 is installed, the phase sequence information is stored in advance in the phase sequence memory unit 61. In this case, a phase sequence in which the terminals 10A to 10C and the terminals 12A to 12C are present in the order of A, B, and C-phases (that is, a forward phase sequence) is stored in the phase sequence memory unit 61 as phase sequence information. Further, when the determination result of the phase difference determination unit 9 indicates that a connection error is not detected, the collation unit 7 refers to the phase sequence information stored in the phase sequence memory unit 61 to compare the phase sequence information with the phase sequence data (phase sequence detection result) obtained in advance to determine the presence of a connection error. That is, the collation unit 7 determines that a connection error is present when the phase sequence of the voltage signals or the current signals does not match the phase sequence information.

Here, although the phase sequence of Pattern (1) appears in the order of B, C, and A-phases and the phase sequence of Pattern (2) appears in the order to C, A, and B-phases, because which phase will be defined as A-phase is arbitrary, the phase sequences of Patterns (1) and (2) are not contradictory to the phase sequence information (the order of A, B, and C-phases) stored in the phase sequence memory unit 61. That is, because the phase sequences of both patterns are forward phase sequences, the phase sequences are not contradictory to the phase sequence information.

Meanwhile, the phase sequence of Pattern (3) appears in the order of A, C, and B-phases, the phase sequence of Pattern (4) appears in the order of C, B, and A-phases, and the phase sequence of Pattern (5) appears in the order of B, A, and C-phases, all phase sequences are different from the phase sequence information (the order of A, B, and C-phases) stored in the phase sequence memory unit, 61. That is, Patterns (3) to (5) are backward phase sequences and do not match the phase sequence information.

Thus, in this case, if a connection error is any one of Patterns (3) to (5), the connection error is detected by this determination process. If a connection error is Pattern (1) or (2), the connection error is not detected in this determination process.

That is, although the backward-phase connection errors (3) to (5) are detected by the exception handling of the collation unit 7 when the phase sequence stored in the phase sequence memory unit 61 appears in a forward phase (the order of A, B, and C-phases), the forward phase connection error (1) or (2) is not detected by the exception handling of the collation unit 7.

Meanwhile, when a connection error is not detected by the exception handling, it may be checked whether the voltage measurement wiring 250A is connected to the terminal 10A. That is, in the case of (1) or (2), it is possible to check that a connection error occurs because the voltage measurement wiring 250A is not connected to the terminal 10A. Instead of checking whether the voltage measurement wiring 250A is connected to the terminal 10A, it may be checked whether the current measurement wiring 251A is connected to the terminal 12A. In any case, the checking operation is easy because it is necessary to check the connection of only one measurement wiring.

Note that in the above description, although a case in which the phase sequence stored in the phase sequence memory unit 61 is a forward phase sequence (the order of A, B, and C-phases) has been described, the same is true when the phase sequence is a backward phase sequence. For example, when Pattern (3) is a correction connection and the phase sequence is a backward phase sequence (the order of A, C, and B-phases), the backward phase connection error (4) or (5) is not detected by the exception handling of the collation unit 7, but the forward phase sequence connection error (1), (2), or (6) is detected by the exception handling of the collation unit 7. If a connection error is not detected by this exception handling, it may be checked whether the voltage measurement wiring 250A is connected to the terminal 10A, for example.

As described above, according to the present embodiment, it is possible to provide the phase control device 400 capable of detecting a connection error of the three-phase voltage measurement wirings 250A to 250C and the current measurement wirings 251A to 251C with a simple configuration and opening and closing the circuit breakers 200A to 200C at a target phase.

Further, the connection error detection unit 50 can be implemented by the function mounted on a one-chip microcomputer and can be configured at a low cost.

Further, in the present embodiment, because the connection error is detected in two steps with different methods on the basis of the phase sequences detected by the phase sequence detection units 5 and 6 and the phase differences detected by the phase difference detection units 8*a* to 8*c*, the detection accuracy is improved.

Because the detection of the phase sequences by the phase sequence detection units 5 and 6 and the detection of the phase differences by the phase difference detection units 8*a* to 8*c* can be performed on the basis of voltage and current measurement values only without requiring other information, the detection process is easy and provides high accuracy.

Although the connection errors of the terminals 10A to 10C and the terminals 12A to 12C occur in 35 patterns, 30 patterns of connection errors with the two steps of processing are detectable. That is, in the present embodiment, it is possible to detect connection errors on the basis of the voltage and current measurement values only excluding some exceptions.

Further, in the present embodiment, by providing the phase sequence information in advance to the phase sequence memory unit 61, it is possible to detect three patterns of the five similar connection error patterns of the voltage measurement wirings 250A to 250C and the current measurement wirings 251A to 251C. Note that because most connection errors excluding some exceptions can be detected by the two steps of processing, a configuration which does not include the phase sequence memory unit 61 is sufficiently useful. Further, as for the remaining two connection error patterns which cannot be detected by the exception handling, it is possible to prevent a connection error in advance by checking the connection of only one measurement wiring.

Second Embodiment

Figure 4:
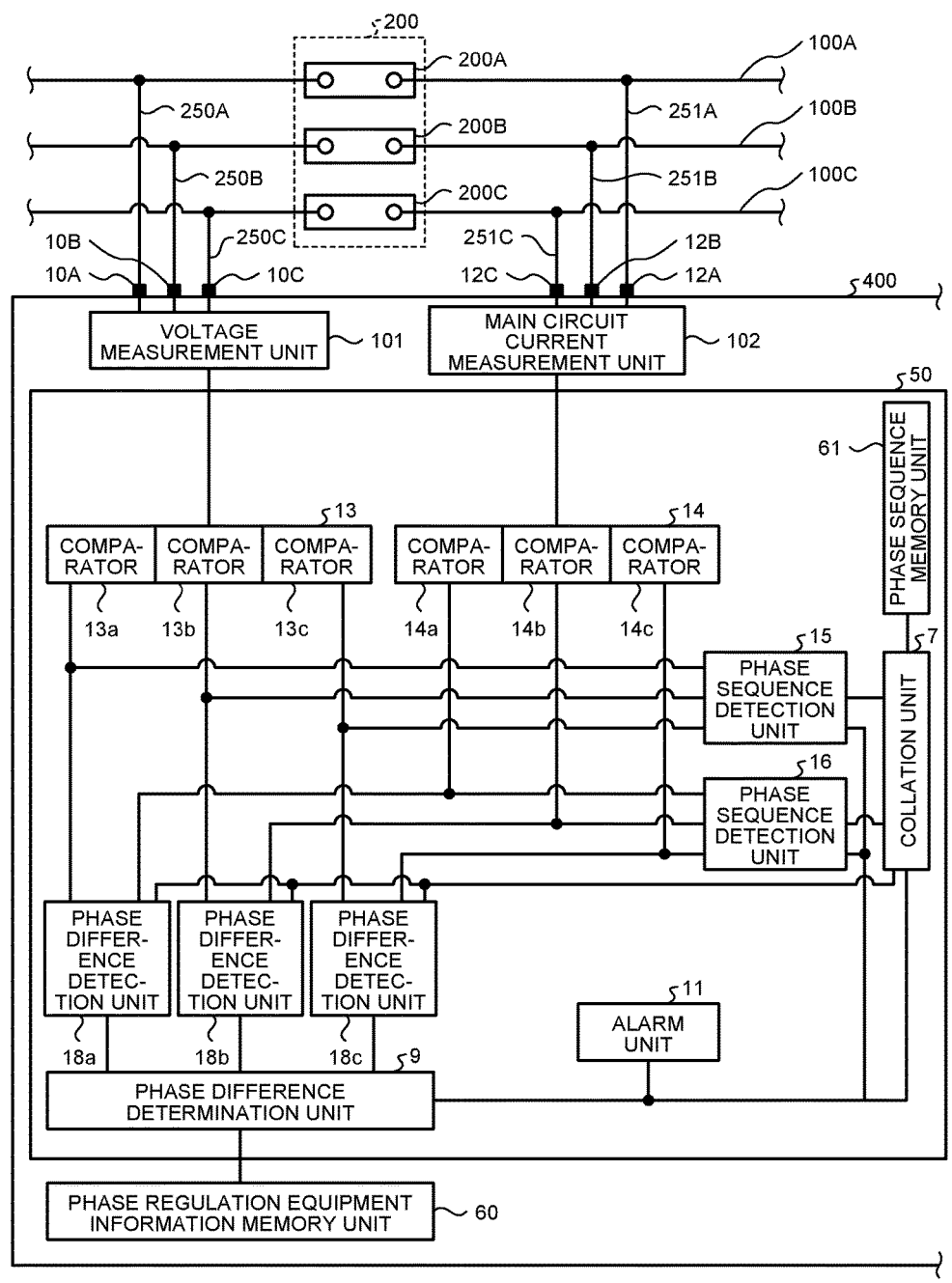
FIG. 4 is a diagram illustrating the configuration of a connection error detection unit according to a second embodiment.

FIG. 4 is a diagram illustrating the configuration of a connection error detection unit according to the present embodiment. Note that in FIG. 4, the same constituent elements as those of FIG. 2 will be denoted by the same reference numerals, detailed description thereof will not be provided, and the difference from FIG. 2 will be mainly described.

The connection error detection unit 50 includes comparators 13 and 14 instead of the A/D converters 1 and 2 and the memories 3 and 4 unlike the first embodiment. The comparator 13 includes comparators 13*a* to 13*c* and the comparator 14 includes comparators 14*a* to 14*c*. Further, phase difference detection units 18*a* to 18*c* each include a timer.

The voltage signal measured by the voltage measurement unit 101 via the terminal 10A is output to the comparator 13*a*. The comparator 13*a* receives the voltage signal and a reference signal (not illustrated) of 0 and outputs Value P if the magnitude of the voltage signal is 0 or more and outputs Value Q ($\neq$P) if the magnitude of the voltage signal is smaller than 0. That is, the comparator 13*a* binarizes the voltage signal. Similarly, the comparator 13*b* binarizes and outputs the voltage signal measured by the voltage measurement unit 101 via the terminal 10B. Similarly, the comparator 13*c* binarizes and outputs the voltage signal measured by the voltage measurement unit 101 via the terminal 10C. The comparators 13*a* to 13*c* output the binarized values to a phase sequence detection unit 15.

The current signal measured by the main circuit current measurement unit 102 via the terminal 12A is output to the comparator 14*a*. The comparator 14*a* receives the current signal and a reference signal (not illustrated) of 0 and outputs Value P if the magnitude of the current signal is 0 or more and outputs Value Q ($\neq$P) if the magnitude of the current signal is smaller than 0. That is, the comparator 14*a* binarizes the current signal. Similarly, the comparator 14*b* binarizes and outputs the current signal measured by the main circuit current measurement unit 102 via the terminal 12B. Similarly, the comparator 14*c* binarizes and outputs the current signal measured by the main circuit current measurement unit 102 via the terminal 12C. The comparators 14a to 14c output the binarized values to a phase sequence detection unit 16.

The phase sequence detection unit 15 detects the phase sequences of the voltage signal detected via the terminal 10A, the voltage signal detected via the terminal 10B, and the voltage signal detected via the terminal 10C on the basis of the output signal of the comparator 13a, the output signal of the comparator 13b, and the output signal of the comparator 13c. That is, for example, the phase sequence detection unit 15 detects the phase sequence by determining that the voltage signal detected via the terminal 10A corresponds to the earliest phase as a reference phase and determining, in the following order, the voltage signal detected via the terminal 10B and the voltage signal detected via the terminal 10C such that a voltage signal having a phase difference of 120° and a phase lead from the other signal corresponds to the next phase.

Specifically, for example, the phase sequence can be detected by comparing the rise time of the output signal of the comparator 13a, the rise time of the output signal of the comparator 13b, and the rise time of the output signal of the comparator 13c and detecting the order of the rise times as the phase sequence. The rise time of the output signal corresponds to the zero-cross point of the first embodiment.

Further, the phase sequence detection unit 16 detects a phase sequence of the current signal detected via the terminal 12A, the current signal detected via the terminal 12B, and the current signal detected via the terminal 12C on the basis of the output signal of the comparator 14a, the output signal of the comparator 14b, and the output signal of the comparator 14c. That is, the phase sequence detection unit 16 detects the phase sequence by determining that the current signal detected via the terminal 12A corresponds to the earliest phase as a reference phase and determining, in the following order, the current signal detected via the terminal 12B and the current signal detected via the terminal 12C such that a current signal having a phase difference of 120° and a phase lead from the other signal corresponds to the next phase.

Specifically, for example, the phase sequence can be detected by comparing the rise time of the output signal of the comparator 14a, the rise time of the output signal of the comparator 14b, and the rise time of the output signal of the comparator 14c and detecting the order of the rise times as the phase sequence. The rise time of the output signal corresponds to the zero-cross point of the first embodiment.

The phase sequence detection unit 15 outputs the phase sequence data of the voltage signals to the collation unit 7. The phase sequence detection unit 16 outputs the phase sequence data of the current signals to the collation unit 7. The collation unit 7 performs the same process as the first embodiment using the phase sequence data output from the phase sequence detection units 15 and 16.

The phase difference detection units 18a is connected to the comparators 13a and 14a. The phase difference detection units 18b is connected to the comparators 13b and 14b. The phase difference detection units 18c is connected to the comparators 13c and 14c. Further, the phase difference detection units 18a to 18c are connected to the phase sequence detection units 15 and 16 and the collation unit 7.

When the collation result in the collation unit 7 indicates that the detection results of the phase sequence of the voltage signals is identical to the detection result of the phase sequence of the current signals, the phase difference detection unit 18a detects a phase difference between the voltage signal detected via the terminal 10A and the current signal detected via the terminal 12A on the basis of the output signal of the comparator 13a and the output signal of the comparator 14a. This phase difference can be detected by calculating a time difference between the rise time of the output signal of the comparator 13a and the rise time of the output signal of the comparator 14a on the basis of the rise time of the output signal of the comparator 13a, for example. Because the phase difference detection unit 18a includes a timer, the phase difference detection unit 18a can start measuring time using the timer at the rise time of the output signal of the comparator 13a and can detect the phase difference as a time difference between the start and the end of the measurement when the measurement on the basis of the timer ends at the rise time of the output signal of the comparator 14a. The phase difference detection units 18b and 18c perform the same process as the phase difference detection unit 18a. That is, the phase difference detection unit 18b detects a phase difference between the voltage signal detected via the terminal 10B and the current signal detected via the terminal 12B on the basis of the output signal of the comparator 13b and the output signal of the comparator 14b. Further, the phase difference detection unit 18c detects a phase difference between the voltage signal detected via the terminal 10C and the current signal detected via the terminal 12C on the basis of the output signal of the comparator 13c and the output signal of the comparator 14c.

The phase difference determination unit 9 determines whether the phase differences (time differences) detected by the phase difference detection units 18a to 18c fall within a determination range on the basis of determination range information for determining a connection error, provided in advance when the phase regulation equipment 210 is not present or according to the type of the phase regulation equipment when the phase regulation equipment 210 is present. When any one of the phase differences does not fall within the determination range, the phase difference determination unit 9 determines that a connection error is present and transmits a control signal that causes the alarm unit 11 to output an alarm signal.

When the three-phase alternating frequency is 60 Hz, for example, one cycle corresponds to approximately 16.66 ms. In a case where the phase regulation equipment 210 is a capacitor bank, for example, the phase difference of 270° when a connection error is not present corresponds to 12.5 ms, and the phase differences of 90°, 30°, and 150° when a connection error is present correspond to 4.16 ms, 1.38 ms, and 6.94 ms, respectively. When a phase difference measurement accuracy of approximately 10° is required, it is necessary to use a timer having an accuracy of approximately 0.46 ms corresponding to 10°.

Figure 5:
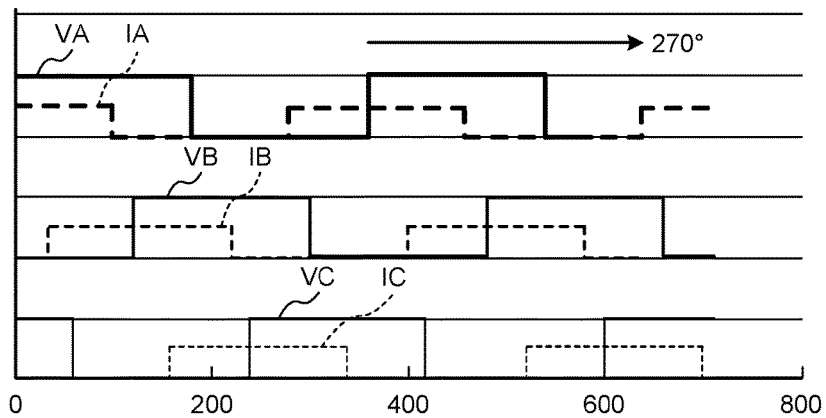
FIGS. 5(A)-5(C) are diagrams illustrating voltage and current signals in a case where the phase regulation equipment is a capacitor bank.
Figure 5:
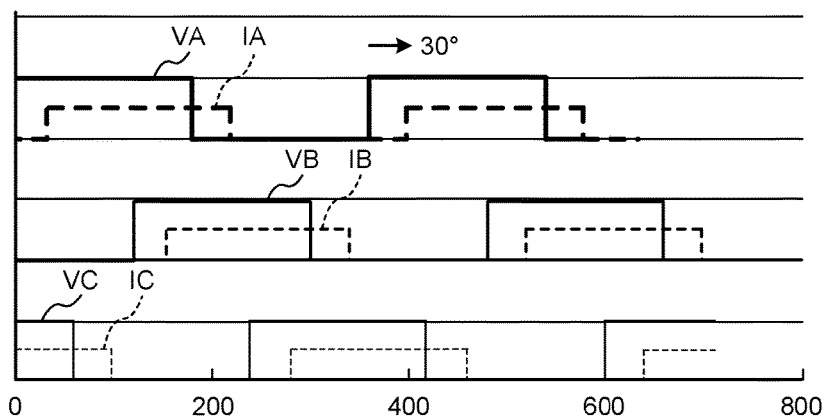
Figure 5:
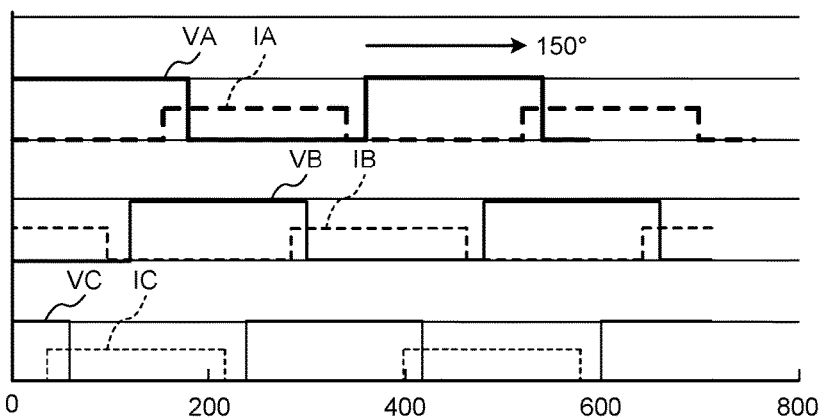
Figure 6:
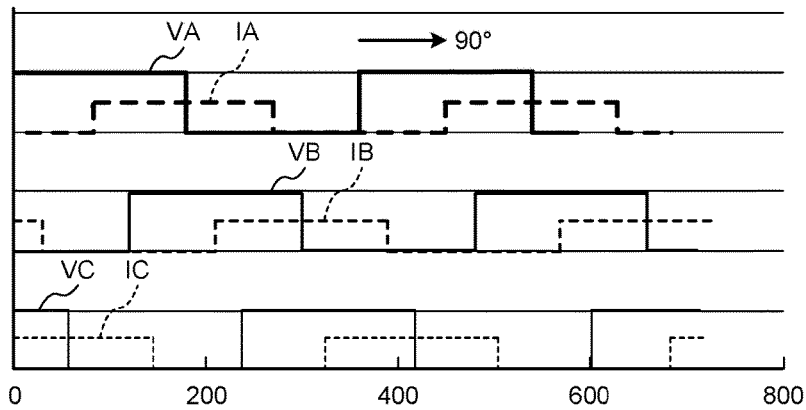
FIGS. 6(A)-6(C) are diagrams illustrating voltage and current signals in a case where the phase regulation equipment is a reactor bank.
Figure 6:
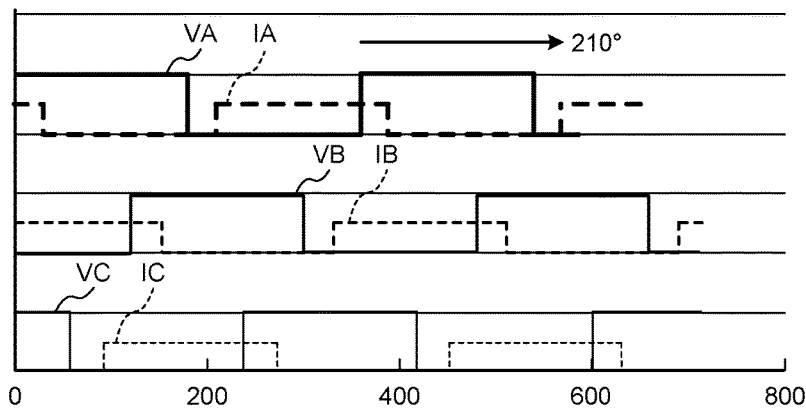
Figure 6:
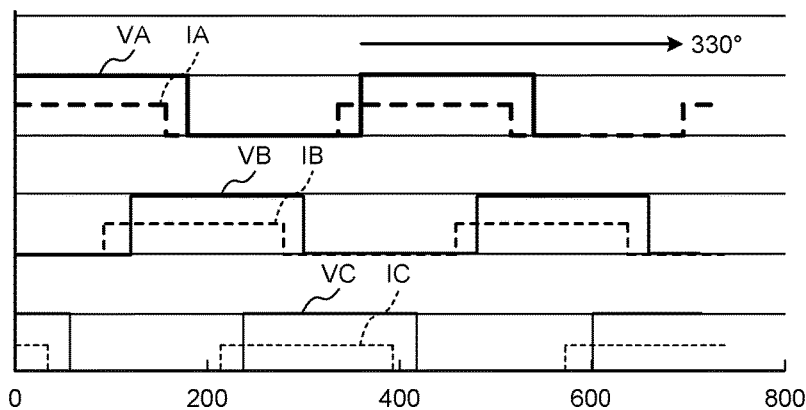

FIGS. 5(A)-5(C) are diagrams illustrating voltage and current signals in a case where the phase regulation equipment 210 is a capacitor bank. FIGS. 6(A)-6(C) are diagrams illustrating voltage and current signals in a case where the phase regulation equipment 210 is a reactor bank.

FIG. 5(A) illustrates a case in which a connection error is not present in both the voltage measurement wirings 250A to 250C and the current measurement wirings 251A to 251C; and VA to VC are binarized signals obtained by the comparators 13a to 13c binarizing the voltage signals detected via the terminals 10A to 10C, respectively. Further, IA to IC are binarized signals obtained by the comparators 14a to 14c binarizing the current signals detected by the terminals 12A to 12C, respectively. In this case, the phase difference between the rise time of the voltage signal VA and the current signal IA is 270°.

FIG. 5(B) illustrates a case in which a connection error is not present in the voltage measurement wirings 250A to 250C and a connection error is present in the current measurement wirings 251A to 251C, and specifically a case in which the current measurement wiring 251C is connected to the terminal 12A, the current measurement wiring 251A is connected to the terminal 12B, and the current measurement wiring 251B is connected to the terminal 12C. VA to VC and IA to IC are the same as described above. In this case, the phase difference between the rise time of the voltage signal VA and the rise time of the current signal IA is 30°.

FIG. 5(C) illustrates a case in which a connection error is not present in the voltage measurement wirings 250A to 250C and a connection error is present in the current measurement wirings 251A to 251C, and specifically a case in which the current measurement wiring 251B is connected to the terminal 12A, the current measurement wiring 251C is connected to the terminal 12B, and the current measurement wiring 251A is connected to the terminal 12C. VA to VC and IA to IC are the same as described above. In this case, the phase difference between the rise time of the voltage signal VA and the rise time of the current signal IA is 150°.

FIG. 6(A) illustrates a case in which a connection error is not present in both the voltage measurement wirings 250A to 250C and the current measurement wirings 251A to 251C, and VA to VC are binarized signals obtained by the comparators 13a to 13c binarizing the voltage signals detected via the terminals 10A to 10C, respectively. Further, IA to IC are binarized signals obtained by the comparators 14a to 14c binarizing the current signals detected by the terminals 12A to 12C, respectively. In this case, the phase difference between the rise time of the voltage signal VA and the current signal IA is 90°.

FIG. 6(B) illustrates a case in which a connection error is not present in the voltage measurement wirings 250A to 250C and a connection error is present in the current measurement wirings 251A to 251C, and specifically a case in which the current measurement wiring 251C is connected to the terminal 12A, the current measurement wiring 251A is connected to the terminal 12B, and the current measurement wiring 251B is connected to the terminal 12C. VA to VC and IA to IC are the same as described above. In this case, the phase difference between the rise time of the voltage signal VA and the rise time of the current signal IA is 210°.

FIG. 6(C) illustrates a case in which a connection error is not present in the voltage measurement wirings 250A to 250C and a connection error is present in the current measurement wirings 251A to 251C, and specifically a case in which the current measurement wiring 251B is connected to the terminal 12A, the current measurement wiring 251C is connected to the terminal 12B, and the current measurement wiring 251A is connected to the terminal 12C. VA to VC and IA to IC are the same as described above. In this case, the phase difference between the rise time of the voltage signal VA and the rise time of the current signal IA is 330°.

Note that the other configurations and operations of the present embodiment are the same as those of the first embodiment. Further, the present embodiment provides the same advantageous effects as those of the first embodiment.

INDUSTRIAL APPLICABILITY

As described above, the present invention is ideally used as a phase control device that controls the opening and closing timing of a circuit breaker to open or close the circuit breaker.

REFERENCE SIGNS LIST 1, 2 A/D CONVERTER
3, 3a-3c, 4, 4a-4c MEMORY
5, 15, 6, 16 PHASE SEQUENCE DETECTION UNIT
7 COLLATION UNIT
8a-8c, 18a-18c PHASE DIFFERENCE DETECTION UNIT
9 PHASE DIFFERENCE DETERMINATION UNIT
10A-10C, 12A-12C TERMINAL
11 ALARM UNIT
13a-13c, 14a-14c COMPARATOR
50 CONNECTION ERROR DETECTION UNIT
60 PHASE REGULATION EQUIPMENT INFORMATION MEMORY UNIT
61 PHASE SEQUENCE MEMORY UNIT
100, 100A-100C MAIN CIRCUIT
101 VOLTAGE MEASUREMENT UNIT
102 MAIN CIRCUIT CURRENT MEASUREMENT UNIT
103 ZERO-POINT DETECTION UNIT
104 OPERATING TIME PREDICTION UNIT
105 CONTROL SIGNAL OUTPUT UNIT
141 OPERATING TIME MEASUREMENT UNIT
142 ENVIRONMENTAL TEMPERATURE MEASUREMENT UNIT
143 CONTROL VOLTAGE MEASUREMENT UNIT
200 CIRCUIT BREAKER
201 AUXILIARY SWITCH
210 PHASE REGULATION EQUIPMENT
250A-250C VOLTAGE MEASUREMENT WIRING
251A-251C CURRENT MEASUREMENT WIRING
300 OPERATION DEVICE
400 PHASE CONTROL DEVICE

The invention claimed is:
1. A phase control device capable of opening and closing a circuit breaker connected to a main circuit, to which a phase regulation equipment capable of regulating reactive power is connected, at a target phase, the phase control device comprising:
first to third voltage measurement terminals to which three-phase voltage measurement wirings for measuring three-phase voltages of the circuit breaker are connected;
first to third current measurement terminals to which three-phase current measurement wirings for measuring three-phase main circuit currents of the main circuit are connected;
a voltage measurement unit that outputs voltage signals measured via the first to third voltage measurement terminals;
a main circuit current measurement unit that outputs current signals measured via the first to third current measurement terminals;
a connection error detection unit capable of detecting a connection error of the three-phase voltage measurement wirings and the three-phase current measurement wirings by using the voltage signals output from the voltage measurement unit and the current signals output from the main circuit current measurement unit; and a phase regulation equipment information memory unit that stores phase regulation equipment information that is information for specifying a type of the phase regulation equipment, wherein the connection error detection unit includes:
  a phase sequence detection unit that detects a phase sequence of the voltage signals detected by the voltage measurement unit via the first to third voltage measurement terminals and a phase sequence of the current signals detected by the main circuit current measurement unit via the first to third current measurement terminals;
  a collation unit that collates the phase sequence of the voltage signals and the phase sequence of the current signals output from the phase sequence detection unit and determines that a connection error is present when the phase sequences are different;
  a phase difference detection unit that detects a first phase difference, which is a phase difference between the voltage signal detected via the first voltage measurement terminal and the current signal detected via the first current measurement terminal, a second phase difference, which is a phase difference between the voltage signal detected via the second voltage measurement terminal and the current signal detected via the second current measurement terminal, and a third phase difference, which is a phase difference between the voltage signal detected via the third voltage measurement terminal and the current signal detected via the third current measurement terminal; and
  a phase difference determination unit that, when a collation result by the collation unit indicates that the phase sequence of the voltage signals is identical to the phase sequence of the current signals,
    refers to the phase regulation equipment information in order to specify the type of the phase regulation equipment,
    determines whether the first to third phase differences output from the phase difference detection unit fall within a determination range that is provided in advance and is provided in advance for the type of the phase regulation equipment in order to detect a connection error, and
    when any one of the first to third phase differences does not fall within the determination range, determines that a connection error is present.

2. The phase control device according to claim 1, further comprising:
an alarm unit, wherein
each of the collation unit and the phase difference determination unit transmits a control signal to the alarm unit so as to cause the alarm unit to output an alarm signal when each of the collation unit and the phase difference determination unit determine that a connection error is present.

3. The phase control device according to claim 1, wherein the connection error detection unit includes:
a first A/D converter that A/D-converts the voltage signals output from the voltage measurement unit;
a second A/D converter that A/D-converts the current signals output from the main circuit current measurement unit;
a first memory that stores the A/D-converted voltage value of the voltage signal detected via the first voltage measurement terminal;
a second memory that stores the A/D-converted voltage value of the voltage signal detected via the second voltage measurement terminal;
a third memory that stores the A/D-converted voltage value of the voltage signal detected via the third voltage measurement terminal;
a fourth memory that stores the A/D-converted current value of the current signal detected via the first current measurement terminal;
a fifth memory that stores the A/D-converted current value of the current signal detected via the second current measurement terminal; and
a sixth memory that stores the A/D-converted current value of the current signal detected via the third current measurement terminal,
the phase sequence detection unit
detects the phase sequence of the voltage signals on the basis of time-sequential voltage values read from the first to third memories, and
detects the phase sequence of the current signals on the basis of time-sequential current values read from the fourth to sixth memories, and
the phase difference detection unit detects the first to third phase differences on the basis of the time-sequential voltage values read from the first to third memories and the time-sequential current values read from the fourth to sixth memories.

4. The phase control device according to claim 3, wherein the phase sequence detection unit
calculates zero-cross points, which are zero points at which the time-sequential voltage values, each read from the first to third memories, change from negative to positive,
compares the zero-cross points from voltage signals each measured via the first to third voltage measurement terminals, and
detects the phase sequence of the voltage signals on the basis of the comparison;
the phase sequence detection unit
calculates zero-cross points, which are zero-points at which the time-sequential current values, each read from the fourth to sixth memories, change from negative to positive,
compares the zero-cross points from the current signals each measured via the first to third current measurement terminals,
detects the phase sequence of the current signals on the basis of the comparison; and
the phase difference detection unit
calculates, from the time-sequential voltage values, zero-cross points, which are zero-points at which the time-sequential voltage values read from the first to sixth memories change from negative to positive,
detects the first phase difference by calculating a difference between the zero-cross point of the voltage signal measured via the first voltage measurement terminal and the zero-cross point of the current signal measured via the first current measurement terminal,
detects the second phase difference by calculating a difference between the zero-cross point of the voltage signal measured via the second voltage measurement terminal and the zero-cross point of the current signal measured via the second current measurement terminal, and detects the third phase difference by calculating a difference between the zero-cross point of the voltage signal measured via the third voltage measurement terminal and the zero-cross point of the current signal measured via the third current measurement terminal.

5. The phase control device according to claim 1, wherein the connection error detection unit includes:

a first comparator that binarizes and outputs the voltage signal detected via the first voltage measurement terminal;

a second comparator that binarizes and outputs the voltage signal detected via the second voltage measurement terminal;

a third comparator that binarizes and outputs the voltage signal detected via the third voltage measurement terminal;

a fourth comparator that binarizes and outputs the current signal detected via the first current measurement terminal;

a fifth comparator that binarizes and outputs the current signal detected via the second current measurement terminal; and a sixth comparator that binarizes and outputs the current signal detected via the third current measurement terminal, the phase sequence detection unit detects the phase sequence of the voltage signals on the basis of the signals output by the first to third comparators and detects the phase sequence of the current signals on the basis of the signals output by the fourth to sixth comparators, and the phase difference detection unit detects the first to third phase differences on the basis of the signals output by the first to third comparators and the signals output by the fourth to sixth comparators.

6. The phase control device according to claim 5, wherein the phase sequence detection unit calculates rise times of the output signals of the first to third comparators so as to detect the phase sequence of the voltage signals by making a comparison with the rise times of the voltage signals measured via the first to third voltage measurement terminals, and calculates rise times of the output signals of the fourth to sixth comparators so as to detect the phase sequence of the current signals by making a comparison with the rise times of the current signals measured via the first to third current measurement terminals, and the phase difference detection unit calculates the rise times of the output signals of the first to sixth comparators, detects the first phase difference by measuring a time difference between the rise time of the voltage signal measured via the first voltage measurement terminal and the rise time of the current signal measured via the first current measurement terminal, detects the second phase difference by measuring a time difference between the rise time of the voltage signal measured via the second voltage measurement terminal and the rise time of the current signal measured via the second current measurement terminal, and detects the third phase difference by measuring a time difference between the rise time of the voltage signal measured via the third voltage measurement terminal and the rise time of the current signal measured via the third current measurement terminal.

7. The phase control device according to claim 1, wherein the connection error detection unit includes a phase sequence memory unit that stores therein in advance phase sequence information that indicates whether the phase sequence of the voltage signals input to the first to third voltage measurement terminals and the phase sequence of the current signals input to the first to third current measurement terminals are forward phase sequence sequences or backward phase sequences, and the collation unit, when a comparison result between the phase sequence of the voltage signals and the phase sequence of the current signals indicates that a connection error is not detected and a determination result in the phase difference determination unit indicates that a connection error is not present, refers to the phase sequence information stored in the phase sequence memory unit, and determines that a connection error is present when the phase sequence of the voltage signals or the current signals does not match the phase sequence information.

* * * * *